United States Patent
Mallick et al.

(10) Patent No.: US 10,770,349 B2
(45) Date of Patent: Sep. 8, 2020

(54) CRITICAL DIMENSION CONTROL FOR SELF-ALIGNED CONTACT PATTERNING

(71) Applicant: Applied Materials, Inc., Santa Clara, CA (US)

(72) Inventors: Abhijit Basu Mallick, Palo Alto, CA (US); Ziqing Duan, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 53 days.

(21) Appl. No.: 15/902,362

(22) Filed: Feb. 22, 2018

(65) Prior Publication Data

US 2018/0240706 A1      Aug. 23, 2018

Related U.S. Application Data

(60) Provisional application No. 62/462,342, filed on Feb. 22, 2017.

(51) Int. Cl.
| | | |
|---|---|---|
| *H01L 21/768* | (2006.01) | |
| *H01L 21/285* | (2006.01) | |
| *H01L 21/02* | (2006.01) | |
| *H01L 21/311* | (2006.01) | |

(52) U.S. Cl.
CPC .. *H01L 21/76897* (2013.01); *H01L 21/02183* (2013.01); *H01L 21/28562* (2013.01); *H01L 21/76831* (2013.01); *H01L 21/76879* (2013.01); *H01L 21/76883* (2013.01);
(Continued)

(58) Field of Classification Search
CPC ......... H01L 21/76897; H01L 21/02614; H01L 23/53257
See application file for complete search history.

(56) References Cited

U.S. PATENT DOCUMENTS

| | | | |
|---|---|---|---|
| 4,671,970 A | 6/1987 | Keiser et al. | |
| 5,824,597 A | 10/1998 | Hong | |
| 6,130,151 A | 10/2000 | Lin et al. | |

(Continued)

FOREIGN PATENT DOCUMENTS

| | | | |
|---|---|---|---|
| JP | 2008108757 A | 5/2008 | |
| JP | 2011060803 A | 3/2011 | |

(Continued)

OTHER PUBLICATIONS

PCT International Search Report and Written Opinion in PCT/US2018/019146 dated May 23, 2018, 12 pages.

(Continued)

*Primary Examiner* — Latanya N Crawford

(74) *Attorney, Agent, or Firm* — Servilla Whitney LLC

(57) ABSTRACT

Processing methods to create self-aligned contacts are described. A conformal liner can be deposited in a feature in a substrate surface leaving a gap between the walls of the liner. A tungsten film can be deposited in the gap of the liner and volumetrically expanded. The expanded film can be removed and replaced with a contact material to a make a contact. In some embodiments, a conformal tungsten film can be formed in the feature leaving a gap between the walls. A dielectric can be deposited in the gap and the conformal tungsten film can be volumetrically expanded to grow two pillars. The pillars can be removed and replaced with a contact material to make two contacts.

20 Claims, 3 Drawing Sheets

(52) U.S. Cl.
CPC .. *H01L 21/02244* (2013.01); *H01L 21/02247* (2013.01); *H01L 21/31122* (2013.01)

(56) References Cited

U.S. PATENT DOCUMENTS

| | | | |
|---|---|---|---|
| 6,143,653 A | 11/2000 | Tsai et al. | |
| 6,528,884 B1 | 3/2003 | Lopatin et al. | |
| 6,576,113 B1 | 6/2003 | Scherer et al. | |
| 6,653,200 B2 | 11/2003 | Olsen | |
| 7,192,803 B1 | 3/2007 | Lin et al. | |
| 7,279,119 B2 | 10/2007 | Hellring et al. | |
| 7,288,463 B1 | 10/2007 | Papasouliotis | |
| 7,541,297 B2 | 6/2009 | Mallick et al. | |
| 7,985,977 B2 | 7/2011 | Gogoi et al. | |
| 8,034,705 B2 | 10/2011 | Choi et al. | |
| 8,338,225 B2 | 12/2012 | Breitwisch et al. | |
| 8,575,753 B2 | 11/2013 | Choi et al. | |
| 8,951,429 B1 | 2/2015 | Liu et al. | |
| 9,012,322 B2 | 4/2015 | Duong et al. | |
| 9,117,884 B1 | 8/2015 | Shaviv et al. | |
| 9,236,292 B2 | 1/2016 | Romero et al. | |
| 9,312,220 B2 | 4/2016 | Lu et al. | |
| 9,324,650 B2 | 4/2016 | Edelstein et al. | |
| 9,362,165 B1 | 6/2016 | Bouche et al. | |
| 9,362,413 B2 | 6/2016 | Yu et al. | |
| 9,368,395 B1 | 6/2016 | Wei et al. | |
| 9,490,202 B2 | 11/2016 | Lin et al. | |
| 9,666,451 B2 | 5/2017 | Wallace et al. | |
| 9,679,781 B2 | 6/2017 | Abatchez et al. | |
| 9,721,888 B2 | 8/2017 | Chang et al. | |
| 9,837,314 B2 | 12/2017 | Smith et al. | |
| 10,083,834 B2* | 9/2018 | Thompson | H01L 21/0338 |
| 10,319,604 B2* | 6/2019 | Duan | H01L 21/32136 |
| 10,319,636 B2* | 6/2019 | Basu | H01L 21/76879 |
| 2002/0098642 A1 | 7/2002 | Harris et al. | |
| 2002/0163081 A1 | 11/2002 | Aoyama | |
| 2003/0102516 A1* | 6/2003 | Sambonsugi | H01L 27/11 257/393 |
| 2003/0143862 A1 | 7/2003 | Iyer | |
| 2004/0067649 A1 | 4/2004 | Hellring et al. | |
| 2004/0192034 A1 | 9/2004 | Ohiwa et al. | |
| 2005/0121768 A1 | 6/2005 | Edelstein et al. | |
| 2005/0167846 A1 | 8/2005 | Aoyama | |
| 2005/0266627 A1 | 12/2005 | Furukawa et al. | |
| 2006/0169576 A1* | 8/2006 | Brown | C23C 14/046 204/192.11 |
| 2006/0286806 A1 | 12/2006 | Ohkuni et al. | |
| 2007/0166981 A1 | 7/2007 | Furukawa et al. | |
| 2007/0199922 A1 | 8/2007 | Shen et al. | |
| 2008/0160783 A1 | 7/2008 | Watanabe et al. | |
| 2008/0182411 A1* | 7/2008 | Elers | C23C 16/34 438/685 |
| 2008/0242097 A1 | 10/2008 | Boescke et al. | |
| 2009/0017631 A1 | 1/2009 | Bencher | |
| 2009/0072409 A1 | 3/2009 | Nitta et al. | |
| 2009/0174040 A1 | 7/2009 | Gogoi et al. | |
| 2009/0269569 A1 | 10/2009 | Fucsko et al. | |
| 2010/0078617 A1 | 4/2010 | Breitwisch et al. | |
| 2010/0096691 A1 | 4/2010 | Shin et al. | |
| 2010/0171220 A1* | 7/2010 | Huang | H01L 21/76834 257/751 |
| 2010/0173494 A1 | 7/2010 | Kobrin | |
| 2010/0203725 A1 | 8/2010 | Choi et al. | |
| 2010/0301480 A1* | 12/2010 | Choi | H01L 27/228 257/751 |
| 2010/0330805 A1 | 12/2010 | Doan et al. | |
| 2011/0049568 A1 | 3/2011 | Lochtefeld et al. | |
| 2011/0057317 A1 | 3/2011 | Koike et al. | |
| 2011/0089393 A1 | 4/2011 | Kuo-Pin et al. | |
| 2011/0207318 A1 | 8/2011 | Usami | |
| 2011/0281417 A1 | 11/2011 | Gordon et al. | |
| 2012/0115302 A1 | 5/2012 | Breitwisch et al. | |
| 2012/0156857 A1 | 6/2012 | Cohen | |
| 2012/0178235 A1 | 7/2012 | Pachamuthu et al. | |
| 2013/0072019 A1 | 3/2013 | Ryan | |
| 2013/0109148 A1 | 5/2013 | Oh et al. | |
| 2013/0241037 A1 | 9/2013 | Jeong et al. | |
| 2013/0264533 A1* | 10/2013 | Hong | H01L 45/04 257/2 |
| 2014/0029181 A1 | 1/2014 | Gstrein | |
| 2014/0264747 A1 | 9/2014 | Barabash | |
| 2014/0264896 A1 | 9/2014 | Wei et al. | |
| 2014/0327140 A1* | 11/2014 | Zhang | H01L 21/76843 257/751 |
| 2015/0111374 A1 | 4/2015 | Bao et al. | |
| 2015/0132901 A1 | 5/2015 | Wang et al. | |
| 2015/0137113 A1 | 5/2015 | Yu et al. | |
| 2015/0170956 A1 | 6/2015 | Naik et al. | |
| 2015/0279736 A1 | 10/2015 | Hotta et al. | |
| 2015/0287675 A1 | 10/2015 | Shaviv | |
| 2015/0325622 A1 | 11/2015 | Zhang et al. | |
| 2015/0357439 A1 | 12/2015 | Liu et al. | |
| 2015/0364420 A1 | 12/2015 | Mei et al. | |
| 2015/0371896 A1 | 12/2015 | Chen et al. | |
| 2016/0049427 A1 | 2/2016 | Zang | |
| 2016/0056074 A1 | 2/2016 | Na | |
| 2016/0056104 A1 | 2/2016 | Bouche et al. | |
| 2016/0068710 A1 | 3/2016 | Wang et al. | |
| 2016/0093635 A1 | 3/2016 | Rabkin et al. | |
| 2016/0111342 A1 | 4/2016 | Huang et al. | |
| 2016/0141416 A1 | 5/2016 | Mariani et al. | |
| 2016/0163587 A1 | 6/2016 | Backes et al. | |
| 2016/0163640 A1 | 6/2016 | Edelstein et al. | |
| 2016/0190008 A1 | 6/2016 | Chandrashekar et al. | |
| 2016/0190009 A1 | 6/2016 | Wallace et al. | |
| 2016/0260779 A1 | 9/2016 | Kawashima et al. | |
| 2017/0076945 A1 | 3/2017 | Hudson | |
| 2017/0077037 A1 | 3/2017 | Kelly et al. | |
| 2017/0186849 A1 | 6/2017 | Chen et al. | |
| 2017/0263563 A1 | 9/2017 | Dutta et al. | |
| 2017/0338149 A1 | 11/2017 | Lin | |
| 2018/0096847 A1* | 4/2018 | Thompson | H01L 21/0338 |
| 2018/0130671 A1 | 5/2018 | Duan et al. | |
| 2018/0144980 A1 | 5/2018 | Basu et al. | |
| 2018/0240706 A1 | 8/2018 | Mallick et al. | |
| 2018/0358260 A1 | 12/2018 | Roy et al. | |
| 2019/0252206 A1* | 8/2019 | Duan | H01L 21/31111 |

FOREIGN PATENT DOCUMENTS

| | | |
|---|---|---|
| JP | 2011233922 A | 11/2011 |
| KR | 100223334 B1 | 10/1999 |
| KR | 20000026588 A | 5/2000 |
| KR | 20020020969 A | 3/2002 |
| WO | 2016/106092 A1 | 6/2016 |
| WO | 2017136577 A1 | 8/2017 |

OTHER PUBLICATIONS

PCT International Preliminary Report on Patentability in PCT/US2018/019146 dated Aug. 27, 2019, 8 pages.
PCT International Search Report and Written Opinion in PCT/US2017/037141 dated Aug. 31, 2017, 11 pages.
PCT International Search Report and Written Opinion in PCT/US2017/053936 dated Jan. 12, 2018, 10 pages.
PCT International Search Report and Written Opinion in PCT/US2017/059737 dated May 18, 2018, 11 pages.
PCT International Search Report and Written Opinion in PCT/US2017/060367 dated Feb. 22, 2018, 9 pages.
PCT International Search Report and Written Opinion in PCT/US2017/060368 dated Jan. 31, 2018, 11 pages.
PCT International Search Report and Written Opinion in PCT/US2018/027284 dated Aug. 2, 2018, 10 pages.
PCT international Search Report and Written Opinion in PCT/US2018/036690 dated Sep. 18, 2018, 9 pages.
PCT International Search Report and Written Opinion in PCT/US2018/048503 dated Dec. 14, 2018, 10 pages.
PCT International Search Report and Written Opinion in PCT/US2018/048504 dated Dec. 13, 2018, 10 pages.
PCT International Search Report and Written Opinion in PCT/US2018/048509 dated Dec. 13, 2018, 10 pages.

(56) References Cited

OTHER PUBLICATIONS

PCT ISR & Written Opinion for PCT/US2018/026026, dated Jul. 26, 2018, 11 pages.

* cited by examiner

CRITICAL DIMENSION CONTROL FOR SELF-ALIGNED CONTACT PATTERNING

CROSS-REFERENCE TO RELATED APPLICATIONS

This application claims priority to U.S. Provisional Application No. 62/462,342, filed Feb. 22, 2017, the entire disclosure of which is hereby incorporated by reference herein.

TECHNICAL FIELD

The present disclosure relates generally to methods of forming contacts for semiconductor devices. In particular, the disclosure relates to processes for forming self-aligned contacts with critical dimension control.

BACKGROUND

The semiconductor industry is rapidly developing chips with smaller and smaller dimensions to gain more functionality per unit area. As the dimensions of devices continue to shrink, so does the gap/space between the devices, increasing the difficulty to physically isolate the devices from one another.

Integrated circuits are made possible by processes which produce intricately patterned material layers on substrate surfaces. Producing patterned materials on a substrate requires controlled methods for deposition and removal of exposed material.

As the feature size of circuits and semiconductor devices keeps shrinking for higher integration density of electronic components, the self-aligned contact is becoming more and challenging, especially when the critical dimension (CD) of contact holes is smaller than the photolithography limit.

Therefore, there is a need in the art for new methods for self-aligned patterning applications.

SUMMARY

One or more embodiments of the disclosure are directed to methods of forming a contact pattern. A substrate having a substrate surface with a feature is provided. The feature has sidewalls and a bottom. A conformal liner is formed in the feature leaving a gap between the conformal liner on the sidewalls of the feature. The gap between the sidewalls of the conformal liner is filled with tungsten. The tungsten is volumetrically expanded by oxidation or nitridation to grow a pillar of tungsten oxide or tungsten nitride.

Additional embodiments of the disclosure are directed to methods of forming a contact pattern. A substrate having a substrate surface with a feature is provided. The feature has sidewalls and a bottom. A conformal tungsten film is formed in the feature leaving a gap between the tungsten film on the sidewalls of the feature. The gap in the tungsten film is filled with a gapfill material. The tungsten is volumetrically expanded by oxidation or nitridation to grow two pillars of tungsten oxide or tungsten nitride.

Further embodiments of the disclosure are directed to methods of forming a contact pattern. A substrate having substrate surface with a feature therein is provided. The feature has sidewalls and a bottom and a width in the range of about 10 nm to about 30 nm. A conformal tungsten film is formed in the feature by atomic layer deposition leaving a gap between the tungsten film on the sidewalls of the feature. The conformal tungsten film has an average thickness in the range of about 2 nm to about 10 nm. The gap in the conformal tungsten film is filled with a gapfill material comprising a dielectric. The tungsten is volumetrically expanded by oxidation or nitridation to grow two pillars of tungsten oxide or tungsten nitride straight up to extend above the substrate surface. The two pillars of tungsten oxide or tungsten nitride are removed to leave two openings and a contact material is deposited in the openings.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1A:
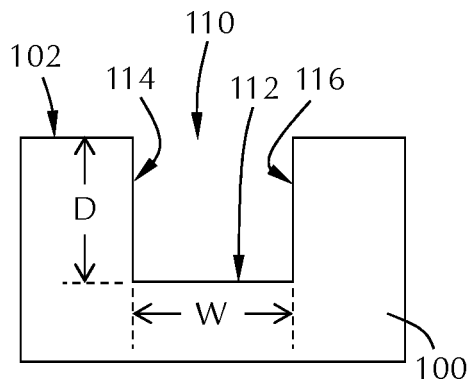
FIGS. 1A through 1E show a method using cross-sectional schematic views of a substrate feature in accordance with one or more embodiment of the disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Self-assembled tungsten oxide (WOx) pillars can be generated through oxidizing gap-filled tungsten films. A tungsten film is deposited on the surface or structure of holes and trenches by atomic layer deposition (ALD) and then oxidized to form WOx. Volumetric expansion during the oxidation process pushes the pillar to grow out of the hole or trench in a straight-up manner. The pillars are bottom-up pillars, selectively grown from tungsten.

One or more embodiments of the disclosure advantageously provide methods utilizing selectively-grown bottom-up pillars to realize the CD shrinkage of self-aligned contacts. In some embodiments, a conformal liner is formed on a feature. The liner can be dielectric materials like SiN, SiCN, SiO$_2$, etc., or other liners like TiN, TaN, TiSiN, Si, C, etc. The trench or hole structure is filled followed by tungsten deposition. The conformal liner can advantageously shrink the CD of the trench or hole. Then WOx pillars with smaller CD can be selectively grow from the tungsten.

Some embodiments advantageously provide methods for CD shrinkage in which conformal W deposition is performed first without filling the trench or hole. The remaining opening or gap is fill with a gap-fill material that can be any material like SiN, SiCN, SiO$_2$, SiOC, TiN, TaN, TiSiN, Si, C, etc. The selectively-grown WOx pillars can be formed with smaller CD.

Some embodiments advantageously provide WOx pillars that can be patterned, removed and replaced with metals to form self-aligned contact. Some embodiments advantageously provide small CD (e.g., <10 nm) self-aligned contact patterning.

FIG. 1A shows a partial cross-sectional view of a substrate 100 with a feature 110. The Figures show substrates having a single feature for illustrative purposes; however, those skilled in the art will understand that there can be more than one feature. The shape of the feature 110 can be any suitable shape including, but not limited to, trenches and cylindrical vias. As used in this regard, the term "feature" means any intentional surface irregularity. Suitable examples of features include, but are not limited to trenches which have a top, two sidewalls and a bottom, peaks which have a top and two sidewalls extending upward from a surface and vias which have sidewalls extending down from a surface with an open bottom. Features can have any suitable aspect ratio (ratio of the depth of the feature to the width of the feature). In some embodiments, the aspect ratio is greater than or equal to about 5:1, 10:1, 15:1, 20:1, 25:1, 30:1, 35:1 or 40:1.

The substrate 100 has a substrate surface 102 with at least one feature 110 forming an opening in the substrate surface 102. The feature 110 extends from the substrate surface 102 to a depth D to a bottom surface 112. The feature 110 has a first sidewall 114 and a second sidewall 116 that define a width W of the feature 110. The open area formed by the sidewalls and bottom may also be referred to as a gap or trench.

With reference to FIGS. 1A through 1E, the substrate 100 is provided for processing. As used in this regard, the term "provided" means that the substrate 100 is placed into a position or environment for further processing.

Figure 1B:
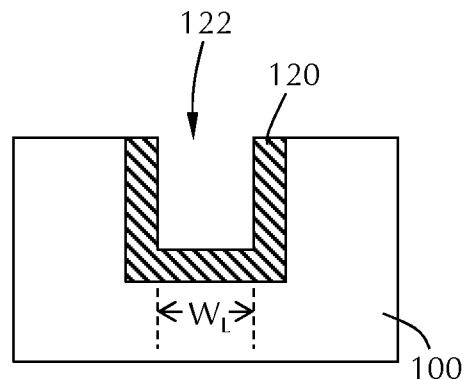

As shown in FIG. 1B, a conformal liner 120 can be formed in the feature 110. The conformal liner 120 is deposited so that there is a gap 122 between the conformal liner 120 deposited on the sidewalls 114, 116 of the feature 110.

In some embodiments, the liner 120 forms conformally on the at least one feature 110. As used herein, the term "conformal", or "conformally", refers to a layer that adheres to and uniformly covers exposed surfaces with a thickness having a variation of less than 1% relative to the average thickness of the film. For example, a 1,000 Å thick film would have less than 10 Å variations in thickness. This thickness and variation includes edges, corners, sides, and the bottom of recesses. For example, a conformal layer deposited by ALD in various embodiments of the disclosure would provide coverage over the deposited region of essentially uniform thickness on complex surfaces.

The width W of the feature 110 and the width $W_L$ of the liner 120 can be any suitable widths. The width can be defined as the average distance between the sidewall 114, 116 of the feature 110, and/or the average distance between the liner 120 deposited on the sidewalls. In some embodiments, the width W of the feature 110 is in the range of about 10 nm to about 100 nm, or in the range of about 15 nm to about 40 nm, or in the range of about 15 nm to about 30 nm, or in the range of about 20 nm to about 30 nm. The width $W_L$ of the gap 122 in the liner 120 of some embodiments is less than or equal to about 20 nm, 15 nm, 10 nm or 5 nm.

The thickness of the conformal liner 120 of some embodiments is in the range of about 1 nm to about 20 nm, or in the range of about 2 nm to about 15 nm, or in the range of about 3 nm to about 12 nm, or in the range of about 4 nm to about 10 nm. In some embodiments, the feature 110 has a width W in the range of about 15 nm to about 40 nm and the conformal liner 120 has an average thickness sufficient to form a gap in the conformal liner 120 with a width $W_L$ in the range of about 5 nm to about 15 nm.

In some embodiments, the conformal liner 120 comprises a low-k dielectric material. As used in this regard, the term "low-k dielectric" refers to a composition with a dielectric constant less than or equal to about 5. The dielectric material of some embodiments comprises one or more of SiN, SiCN, SiO$_2$, TiN, TaN, TiSiN, Si or C. In one or more embodiments, the dielectric material consists essentially of one or more of SiN, SiCN, SiO$_2$, TiN, TaN, TiSiN, Si or C. As used in this manner, "consists essentially of" means that the dielectric material is greater than or equal to about 95%, 98% or 99% by weight of the stated component.

Figure 2:
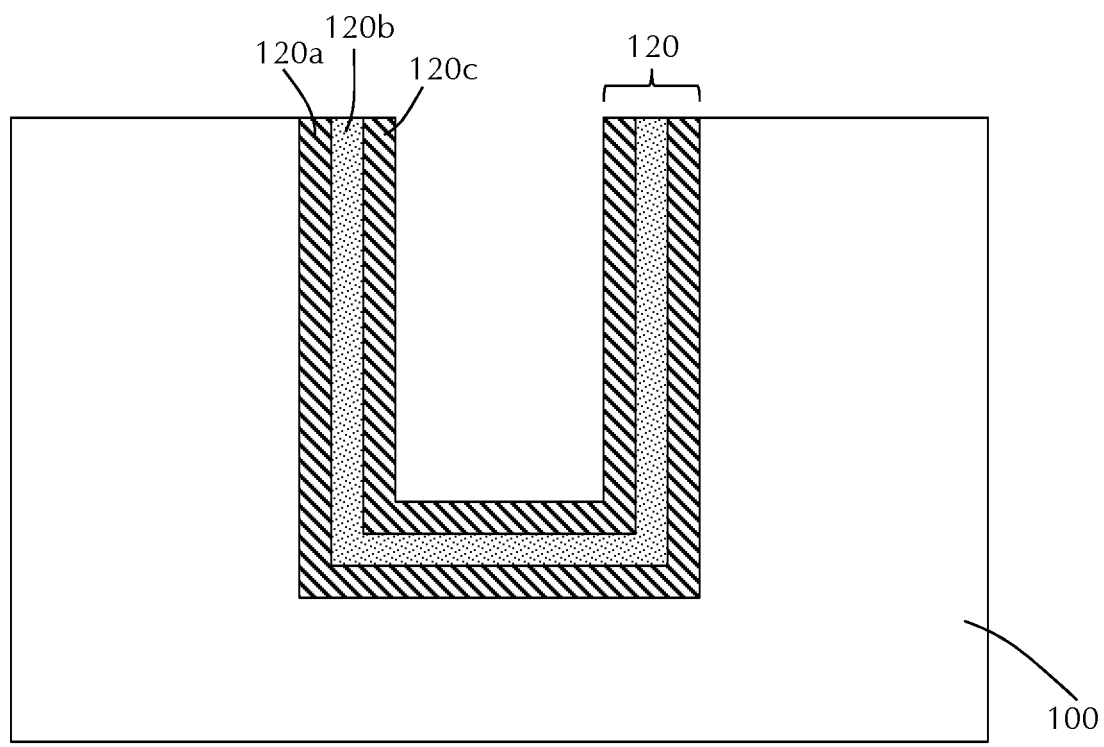
FIG. 2 show a cross-sectional schematic view of a multilayer conformal liner in accordance with one or more embodiment of the disclosure.

FIG. 2 shows an embodiment in which the conformal liner 120 comprises multiple layers 120a, 120b, 120c. In some embodiments, at least one layer is a low-k dielectric.

While tantalum nitride (TaN) can be conductive, TaN may be useful as a dielectric liner material when incorporated in sufficiently small amounts. In some embodiments, at least one layer of the conformal liner 120 comprises TaN. For example, layers 120a, 120c of FIG. 2 may comprise a low-k dielectric (e.g., SiO$_2$) and layer 120b may comprise TaN.

Figure 1C:
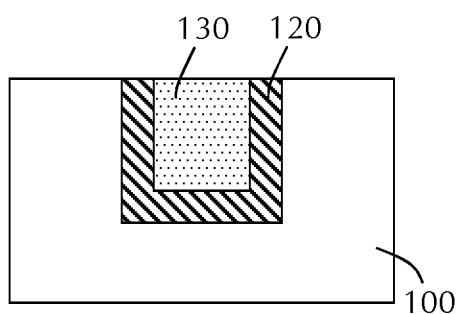

Referring to FIG. 1C, the gap 122 between the sidewalls of the conformal liner 120 can be filled with a gapfill material 130. The gapfill material 130 can be any suitable gapfill material and can be filled by any suitable techniques. In some embodiments, the gapfill material comprises tungsten. In some embodiments, the gapfill material 130 is deposited by atomic layer deposition.

In some embodiments, the gapfill material 130 is a metal film or a metal containing film. Suitable metal films include, but are not limited to, films including one or more of Co, Mo, W, Ta, Ti, Ru, Rh, Cu, Fe, Mn, V, Nb, Hf, Zr, Y, Al, Sn, Cr and/or La. In some embodiments, the gapfill material 130 consists essentially of tungsten. As used in this regard, the term "consists essentially of tungsten" (or other specific component) means that the film is greater than or equal to about 95%, 98% or 99% tungsten (or other specific component) on an atomic basis.

Figure 1D:
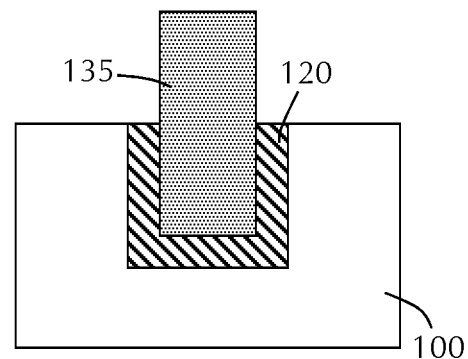

After filling the gap 122 with the gapfill material 130, the gapfill material 130 can be volumetrically expanded by oxidation or nitridation to grow a pillar 135, as shown in FIG. 1D. In some embodiments, volumetrically expanding the gapfill material 130 (e.g., tungsten) grows a pillar (e.g., tungsten oxide) straight up to extend above the substrate surface. As used in this manner, the term "straight up" means that the subject film grows orthogonally to the adjacent surface and is not limited to a vertical growth direction. As shown in FIG. 1D, during expansion, the fidelity of the feature shape is maintained on the top of the feature so that the gapfill material 130 grows straight up from the feature 110.

The gapfill material 130 can be oxidized by exposure to an oxidizing agent or oxidizing conditions to convert the metal or metal containing film to a metal oxide film. As shown in FIG. 1D, the oxidative conversion causes a volumetric expansion of the gapfill material 130. The expansion of the gapfill material 130 can be in the range of about 10% to about 1000%, or in the range of about 50% to about 800%, or in the range of about 100% to about 700%. In some embodiments, the gapfill material 130 expands by an amount greater than or equal to about 150%, 200%, 250%, 300% or 350%. In some embodiments, the gapfill material 130 expands an amount in the range of about 200% to about 400%.

In some embodiments, expanding the gapfill material 130 comprises one or more of oxidizing or nitriding the gapfill material 130. In one or more embodiments, oxidizing or nitriding the gapfill material 130 to form the pillar 135 comprises exposing the gapfill material to an oxidizing agent or nitriding agent comprising one or more of $O_2$, $O_3$, $N_2O$, $H_2O$, $H_2O_2$, CO, $CO_2$, $NH_3$, $N_2H_4$, $NO_2$, $N_2$, $N_2$/Ar, $N_2$/He or $N_2$/Ar/He. In some embodiments, the oxidizing conditions comprise a thermal oxidation, plasma enhanced oxidation, remote plasma oxidation, microwave and radio-frequency (e.g., ICP, CCP).

Oxidation of the gapfill material 130 can occur at any suitable temperature depending on, for example, the composition of the film and the oxidizing agent. In some embodiments, the oxidation occurs at a temperature in the range of about 25° C. to about 1100° C. In some embodiments, oxidation occurs at a temperature greater than or equal to about 250° C., 300° C., 350° C., 400° C., 450° C., 500° C. or 550° C.

Figure 1E:
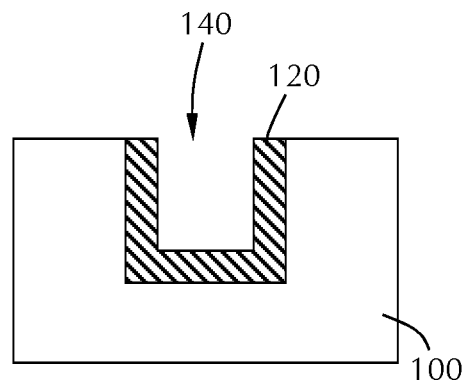

In some embodiments, the pillar 135 (e.g., tungsten oxide or tungsten nitride) is removed to leave an opening. A contact material (e.g., a metal) can be deposited in the opening to form a contact line. As shown in FIG. 1E, removal of the pillar 135 (e.g., by etching) can be selective for the pillar 135 relative to the other materials present. Etching of the pillar 135 leaves an opening 140 in the liner 120.

Etching of the pillar 135 can be done by any suitable technique. In some embodiments, etching the pillar 135 comprises exposing the pillar 135 to a metal halide compound. In some embodiments, etching the pillar 135 comprises exposure to a metal-and-halogen-containing precursor (e.g. $WCl_6$), also referred to as a metal halide precursor.

In some embodiments, exposure to the metal halide precursor causes an exothermic reaction with the pillar 135 and no plasma is present in the substrate processing region. No plasma excites the metal-halide precursor prior to entering the substrate processing region according to one or more embodiments.

In an exemplary non-limiting process, the gapfill material 130 comprises tungsten and is expanded by reaction with oxygen to form the pillar 135 of tungsten oxide, which may take the form of $WO_3$. Exposure of $WO_3$ to $WCl_6$ (or possibly $WCl_5$) forms volatile $WOCl_4$ and/or $WO_2Cl_2$ which leaves the surface until all tungsten oxide is removed. The reaction can spontaneously stop once the tungsten oxide portion (or metal oxide portion in general) is removed. The process can be repeated an integral number of cycles. Each cycle may remove a selectable amount of the original tungsten film (e.g. 1 or 2 monolayers).

In some embodiments, the metal halide precursor includes two or more or only two different elements including a metal element and a halogen element. The metal halide precursor may include only a single atom of the metal element but multiple atoms of the same halogen element (as is the case for $WCl_6$ and $WCl_5$). The metal element of the metal halide may include one or more of titanium, hafnium, zirconium, vanadium, niobium, tantalum, chromium, molybdenum, tungsten, manganese, rhenium, technetium, iron, aluminum and gallium in embodiments. In some embodiments, the metal element of the metal halide has an atomic number of 22, 23, 24, 40, 41, 42, 72, 73 or 74. In one or more embodiments, the metal element comprises an element of group 4, group 5 or group 6 of the periodic table or may be transition metals. The halogen element may be one of F and Cl according to one or more embodiments. The halogen element may be one or more of F, Cl, Br and/or I in some embodiments. In some embodiments, the metal-and-halogen-containing precursor fluorine-free. Some examples of suitable metal halide precursors include, but are not limited to, vanadium pentahalides, tantalum pentahalides, chromium hexahalides, molybdenum pentahalides, molybdenum hexahalides, niobium pentahalides, tungsten pentahalides, tungsten hexahalides, and manganese tetrahalides. In some embodiments, the metal halide precursors include, but are not limited to, vanadium halides, tantalum halides, chromium halides, molybdenum halides, niobium halides, tungsten halides and/or manganese halides, where the oxidation state of the metal element can be any suitable oxidation state.

The etch processes of some embodiments has a selectivity greater than or equal to about 10:1, greater than or equal to about 15:1, greater than or equal to about 20:1 or greater than or equal to about 25:1.

In some embodiments, there is little or no local plasma used in the etch process to make etch processes more selective, delicate and isotropic. The term "plasma-free" will be used herein to describe the substrate processing region during application of no or essentially no plasma power to the substrate processing region. The etchants (the metal-and-halogen-containing precursor) described possess energetically favorable etch reaction pathways which enable the substrate processing region to be plasma-free during operations of etching metal-containing materials herein. Stated another way, the electron temperature in the substrate processing region may be less than 0.5 eV, less than 0.45 eV, less than 0.4 eV, or less than 0.35 eV according to one or more embodiments. Moreover, the metal-and-halogen-containing precursor may have not been excited in any remote plasma prior to entering the substrate processing region in embodiments. For example, if a remote plasma region or a separate chamber region is present and used to conduct the halogen-containing precursor toward the substrate processing region, the separate chamber region or remote plasma region may be plasma-free as defined herein.

The substrate processing region and any remote regions through which the metal-and-halogen-containing precursors pass may be "hydrogen-free" according to one or more embodiments. Hydrogen and —OH groups, in embodiments, may add material to metals and metal nitrides such that the etch process is hindered. The metal film or the metal nitride film may become thicker instead of thinner. The presence of hydrogen in the substrate processing region may reduce the effective etch selectivity.

In some embodiments, the metal-and-halogen-containing precursor (e.g. $WCl_6$) is supplied with a carrier gas at a flow rate of in the range of about 5 sccm and 500 sccm, in the range of about 10 sccm and 300 sccm, in the range of about 25 sccm and 200 sccm, in the range of about 50 sccm and 150 sccm or in the range of about 75 sccm and 125 sccm.

The reactions may proceed thermally, excited only by the temperature of the substrate itself, according to one or more embodiments. In embodiments which use the temperature of the substrate to effect the etching reaction, the term "plasma-free" may be used herein to describe the substrate processing region during application using no or essentially no plasma power. The plasma power may also be kept below small threshold amounts to enable the appropriate reactions to proceed. The plasma power applied to the substrate processing region may be less than 100 watts, less than 50 watts, less than 30 watts, less than 10 watts and may be 0 watts in various embodiments. The pressure within the substrate processing region may be in the range of about 0.1 Torr and 50 Torr, in the range of about 0.2 Torr and 30 Torr, in the range of about 0.5 Torr and 20 Torr, in the range of about 1 Torr and 10 Torr in embodiments.

FIGS. 3A through 3F illustrate another embodiment of a method of forming a contact pattern. A conformal film 220 is formed in the feature 110 leaving a gap 225 between the conformal film 220 on the sidewalls 114, 116 of the feature 110. The conformal film 220 can be made of any suitable material. In some embodiments, the conformal film 220 comprises tungsten. In some embodiments, the conformal film 220 consists essentially of tungsten.

The conformal film 220 can be formed by any suitable process or technique including, but not limited to atomic layer deposition (ALD), chemical vapor deposition (CVD), plasma enhanced atomic layer deposition (PEALD), plasma enhanced chemical vapor deposition (PECVD) or physical vapor deposition (PVD). In some embodiments, the conformal film 220 is deposited by atomic layer deposition.

The thickness of the conformal film 220 can vary and will affect the thickness of a contact line formed by the process. In some embodiments, the conformal film 220 has an average thickness in the range of about 1 nm to about 15 nm, or in the range of about 1.5 nm to about 10 nm, or in the range of about 2 nm to about 10 nm, or in the range of about 2 nm to about 8 nm, or in the range of about 2 nm to about 5 nm. In some embodiments, the conformal film 220 comprises or consists essentially of tungsten with an average thickness in the range of about 2 nm to about 5 nm and the conformal film 220 is substantially continuous. As used herein, the term "continuous" refers to a layer that covers an entire exposed surface without gaps or bare spots that reveal material underlying the deposited layer. A continuous layer may have gaps or bare spots with a surface area less than about 1% of the total surface area of the film.

Figure 3A:
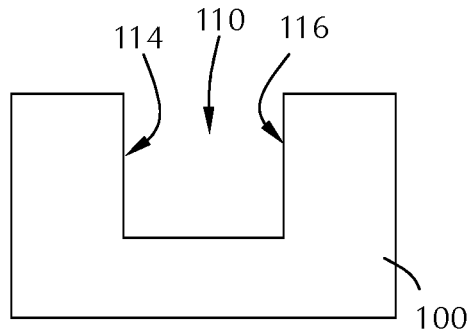
FIGS. 3A through 3F show a method using cross-sectional schematic views of a substrate feature in accordance with one or more embodiment of the disclosure.
Figure 3B:
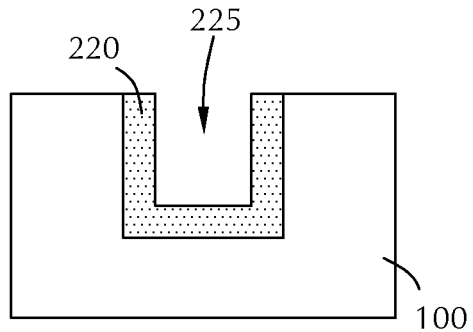
Figure 3C:
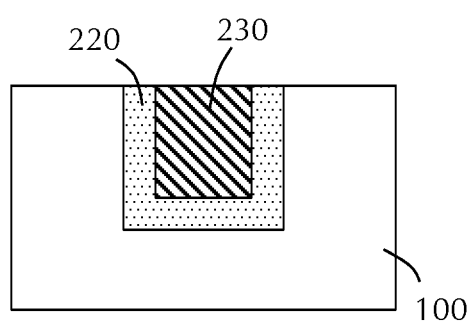

As shown in FIG. 3C, the gap 225 can be filled with a gapfill material 230. The gapfill material 230 can be any suitable material including, but not limited to, dielectric materials. In some embodiments, the gapfill material 230 comprises a low-k dielectric. In some embodiments, the gapfill material 230 comprises a high-k dielectric (e.g., a dielectric constant greater than about 5).

Figure 3D:
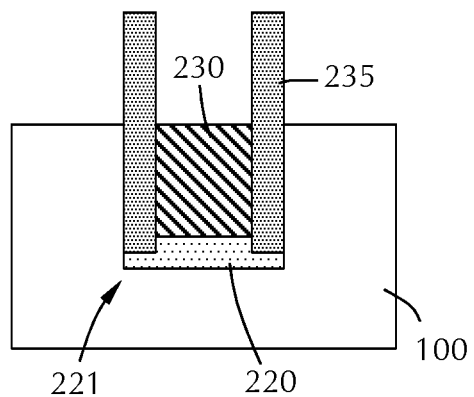

After filling the gap 225 with the gapfill material 230, the conformal film 220 is volumetrically expanded by oxidation or nitridation to grow two pillars 235 comprising an oxide or nitride of the material making up the conformal film 220. In some embodiments, the conformal film 220 comprises tungsten and the pillars comprise one or more of tungsten oxide or tungsten nitride. As shown in FIG. 3D, the volumetric expansion of the conformal film 220 may not reach the portion of the film 221 near the bottom of the feature 110 so that there is some amount of the conformal film 220 that remains.

Figure 3E:
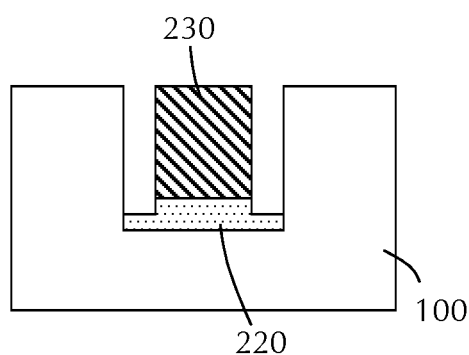
Figure 3F:
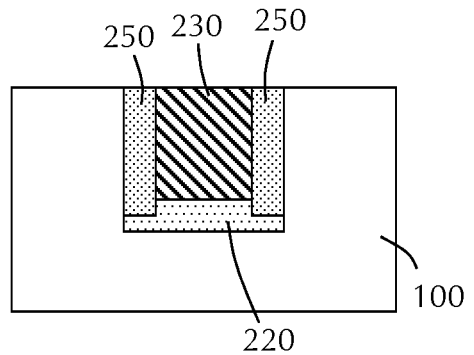

As shown in FIG. 3E, the pillars 235 can be removed by etching, or other process as described herein. Removing the pillars 235 leave two openings 240. The openings, as shown in FIG. 3F, can be filled with a contact material 250 to form contacts.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure.

Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method of forming a contact pattern, the method comprising:
   providing a substrate having a substrate surface with a feature, the feature having sidewalls and a bottom;
   forming a conformal liner in the feature, leaving a gap between the conformal liner on the sidewalls of the feature;
   filling the gap between the sidewalls of the conformal liner with tungsten; and
   volumetrically expanding the tungsten by nitridation to grow a pillar of tungsten nitride extending above the substrate surface.

2. The method of claim 1, wherein the tungsten is deposited by atomic layer deposition.

3. The method of claim 1, wherein volumetrically expanding the tungsten grows a pillar of tungsten nitride straight up to extend above the substrate surface.

4. The method of claim 1, wherein the gap between the sidewalls of the conformal liner has a width less than or equal to about 10 nm.

5. The method of claim 1, wherein the conformal liner comprises a low-k dielectric.

6. The method of claim 5, wherein the conformal liner comprises multiple layers, wherein at least one layer is a low-k dielectric.

7. The method of claim 6, wherein at least one layer of the multiple layers comprises TaN.

8. The method of claim 5, wherein the low-k dielectric comprises one or more of SiN, SiCN, $SiO_2$, TiN, TaN, TiSiN, Si or C.

9. The method of claim 1, wherein the conformal liner has an average thickness in the range of about 2 nm to about 15 nm.

10. The method of claim 9, wherein the feature has a width in the range of about 15 nm to about 40 nm and the conformal liner has an average thickness sufficient to form a gap in the conformal liner with a width in the range of about 5 nm to about 15 nm.

11. The method of claim 1, further comprising removing the tungsten nitride pillar to leave an opening and depositing a contact material in the opening.

12. A method of forming a contact pattern, the method comprising:
   providing a substrate having a substrate surface with a feature therein, the feature having sidewalls and a bottom;
   forming a conformal tungsten film in the feature, leaving a gap between the tungsten film on the sidewalls of the feature;
   filling the gap in the tungsten film with a gapfill material; and
   volumetrically expanding the tungsten by nitridation to grow two pillars of tungsten nitride extending above the substrate surface.

13. The method of claim 12, further comprising removing the pillars to leave two openings and depositing a contact material in the openings.

14. The method of claim 12, wherein the conformal tungsten film is formed by atomic layer deposition.

15. The method of claim 12, wherein volumetrically expanding the tungsten grows pillars of tungsten nitride straight up to extend above the substrate surface.

16. The method of claim 12, wherein the conformal tungsten film has an average thickness in the range of about 2 nm to about 10 nm.

17. The method of claim 12, wherein the conformal tungsten film has an average thickness in the range of about 2 nm to about 5 nm and the conformal tungsten film is substantially continuous.

18. The method of claim 12, wherein the gapfill material comprises a dielectric.

19. The method of claim 12, wherein the feature has a width in the range of about 10 nm to about 30 nm.

20. A method of forming a contact pattern, the method comprising:

providing a substrate having a substrate surface with a feature therein, the feature having sidewalls and a bottom and a width in the range of about 10 nm to about 30 nm;

forming a conformal tungsten film in the feature by atomic layer deposition leaving a gap between the tungsten film on the sidewalls of the feature, the conformal tungsten film having an average thickness in the range of about 2 nm to about 10 nm;

filling the gap in the conformal tungsten film with a gapfill material comprising a dielectric;

volumetrically expanding the tungsten by nitridation to grow two pillars of tungsten nitride straight up to extend above the substrate surface;

removing the two pillars of tungsten nitride to leave two openings; and depositing a contact material in the openings.

* * * * *